(12) United States Patent
Andreoni et al.

(10) Patent No.: US 8,273,618 B2
(45) Date of Patent: Sep. 25, 2012

(54) FORMATION OF HIGH-K GATE STACKS IN SEMICONDUCTOR DEVICES

(75) Inventors: Wanda Andreoni, Adliswil (CH);
Alessandro Curioni, Gattikon (CH);
Carlo A. Pignedoli, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 12/637,787

(22) Filed: Dec. 15, 2009

(65) Prior Publication Data
US 2010/0171187 A1 Jul. 8, 2010

(30) Foreign Application Priority Data

Dec. 16, 2008 (EP) .................................. 08171737

(51) Int. Cl.
*H01L 21/8238* (2006.01)
(52) U.S. Cl. .................. 438/216; 438/197; 438/591
(58) Field of Classification Search .................. 438/216, 438/197, 591; 257/368
See application file for complete search history.

(56) References Cited

U.S. PATENT DOCUMENTS

| | | | |
|---|---|---|---|
| 656,249 A1 | 5/2003 | Jeon | |
| 2005/0280105 A1 | 12/2005 | Andreoni et al. | |
| 2006/0128168 A1 | 6/2006 | Ahn et al. | |
| 2007/0037415 A1 | 2/2007 | Ahn et al. | |
| 2009/0212351 A1* | 8/2009 | Chen | 257/324 |
| 2010/0261342 A1* | 10/2010 | Clark et al. | 438/591 |

FOREIGN PATENT DOCUMENTS

| | | |
|---|---|---|
| CN | 1281246 A | 1/2001 |
| CN | 1420528 A | 5/2003 |
| CN | 1870289 A | 11/2006 |
| CN | 101156246 A | 4/2008 |

OTHER PUBLICATIONS

V. Narayanan, et al., "Band-Edge High-Performance High-k/Metal Gate n-MOSFETs . . . Beyond", 2006 Symposium on VLSI Technology Digest of Technical Papers.
Sufi Zafar, et al., "Charge trapping related threshold voltage . . . stacks", Journal of Applied Physics, vol. 93, No. 11, Jun. 2003.
Masahiko Hiratani, et al., "Effective Electron Mobility Reduced by Remote Charge . . . Stacks", Jpn J. Appl. Physics, vol. 41, (2002), pp. 4521-4522.
Massimo V. Fischetti, et al., "Effective Electron Mobility in Si Inversion Layers . . . Scattering", Journal of Applied Physics, vol. 9, No. 9, Nov. 1, 2001.

* cited by examiner

*Primary Examiner* — Long Tran
(74) *Attorney, Agent, or Firm* — Tutunjian & Bitetto, P.C.; Gail H. Zarick

(57) ABSTRACT

A method of forming a high-K gate stack for a MOSFET device to control the threshold voltage for the MOSFET device. A first high-K metallic oxide layer is formed on a semiconductor substrate. At least one composite layer is then formed directly on the first layer. The composite layer is composed of a second high-K metallic oxide layer formed directly on a dipole induction layer. The dipole induction layer includes a high-K metallic oxide having higher oxygen vacancy affinity and lower oxygen vacancy diffusivity than the first and second layers. A metallic gate electrode is then formed on the composite layer. Formation of the various layers is such as to position the dipole induction layer of the composite layer between the gate electrode and substrate so as to shift the threshold voltage to a desired level. A high-K gate stack in a MOSFET device formed by the above method is also provided.

17 Claims, 4 Drawing Sheets

US 8,273,618 B2

FORMATION OF HIGH-K GATE STACKS IN SEMICONDUCTOR DEVICES

CROSS REFERENCE TO RELATED APPLICATION

This application claims priority under 35 U.S.C. 119 from European Patent Application 08171737.3, filed Dec. 16, 2008, the entire contents of which are incorporated herein by reference.

BACKGROUND OF THE INVENTION

1. Field of the Invention

The present invention relates generally to formation of high-K gate stacks in semiconductor devices. More particularly, methods are provided for formation of high-K gate stacks for MOSFET devices so as to control the MOSFET threshold voltage. Preferred embodiments provide threshold voltage control in conjunction with improved channel carrier mobility.

2. Description of Related Art

Metal-oxide-semiconductor (MOS) devices form the basis of the CMOS (complementary metal-oxide-semiconductor) logic employed in most modern-day integrated circuits. CMOS technology employs nMOS (n-channel) and pMOS (p-channel) field effect transistors (FETs) wired together in a complementary fashion. The gate structure for such MOSFETs is formed as a layer structure, or "stack", in which one or more layers of dielectric material are formed on a semiconductor (typically silicon) substrate, and the gate electrode is then formed on the dielectric.

Early devices used $SiO_2$ as the gate dielectric with a polysilicon gate electrode. However, as feature sizes decreased to meet scaling demands, the reduction in oxide thickness led to significant gate oxide leakage currents due to direct tunneling. To remedy this for the new generation of VLSI (very large scale integration), the gate dielectric has been replaced by materials with a higher dielectric constant K than $SiO_2$. Such "high-K" dielectrics thus have a dielectric constant higher than 3.9, and typically considerably higher than this. For example, K=5 might be considered moderately high, with K=20 currently being considered very high. The high-K materials used for gate dielectrics are metallic oxides, typically $HfO_2$ or HfOSi. In a related development, metallic gate electrodes have replaced polysilicon gates for improved compatibility with the high-K dielectrics.

As discussed in "Low Tinv ($\leq$1.8 nm) Metal-Gated MOSFETs on $SiO_2$ Based Gate Dielectrics for High Performance Logic Applications", Callegari et al. Int. Conf. SSDM, September 16-18, Tokyo, Japan 2003, electron mobilities of metal/high K gate stacks formed on Si substrates are severely degraded when compared with polysilicon/$SiO_2$ gate stacks. This mobility degradation has been attributed to remote phonon scattering (see "Effective electron mobility in Si inversion layers in MOS systems with a high-k insulator: The role of remote phonon scattering", M. V. Fischetti et al, J. Appl. Phys. 90, 4587 (2001)) or to remote charge scattering (see "Effective Electron Mobility Reduced by Remote Charge Scattering in High-K Gate Stacks", M. Hiratani et al., JJAP Vol. 41, p. 4521, (2002)).

An attempt to solve this problem has been proposed in "Charge trapping related threshold voltage instabilities in high permittivity gate dielectric stacks", A. Callegari et al., J. Appl. Phys. 99, 023079 (2006). This proposes using $HfO_2$ stacks that are graded in concentration towards the silicon channel. This technique led to devices with good electrical properties, and in particular good channel mobilities, but caused too large a shift in the device threshold voltage.

An attempt to solve this additional problem has been presented in "Band-Edge High-Performance High-k/Metal Gate n-MOSFETs using Cap Layers Containing Group IIA and IIIB Elements with Gate-First Processing for 45 nm and Beyond", V. Narayanan et al., VLSI Symposium, June 2006. This proposed a gate stack structure as illustrated in FIG. 1 of the accompanying drawings. In particular, a lanthanum oxide layer was added on top of the $HfO_2$ dielectric and under the metal gate. This improved the threshold voltage shift but only for nFET devices, not for pFETs. In addition, the introduction of the new layer led to a substantial degradation of mobility in the channel. Other attempts to solve the mobility problem in metal/high K gate stacks propose using Hf silicate materials to reduce phonon scattering and thereby improve mobility. However, these silicate materials have a lower dielectric constant (K~12) than $HfO_2$ (K~20), thus limiting device scalability. In particular, a silicate material layer of less than 23 Å appears to be difficult to achieve, whereas $HfO_2$ layers of about 12 Å were achieved in the Callegari et al. 2003 reference above.

SUMMARY OF THE INVENTION

According to an aspect of the present invention, a method for forming a high-K gate stack for a MOSFET device, to control the threshold voltage for the MOSFET device, includes the steps of: forming a first high-K metallic oxide layer on a semiconductor substrate; forming a composite layer directly on the first layer, the composite layer including a second high-K metallic oxide layer formed directly on a dipole induction layer, the dipole induction layer including a high-K metallic oxide having higher oxygen vacancy affinity and lower oxygen vacancy diffusivity than the first and second layers; and forming a metallic gate electrode on the composite layer. The formation of the layers is such as to position the dipole induction layer of the composite layer between the gate electrode and substrate to shift the threshold voltage to a desired level.

A high-K gate stack in a MOSFET device formed by the above method is also provided.

BRIEF DESCRIPTION OF THE DRAWINGS

Preferred embodiments of the present invention will now be described, by way of example, with reference to the accompanying drawings in which.

DESCRIPTION OF PREFERRED EMBODIMENTS

The present invention is based on a development in understanding concerning the behaviour and effect of induced oxygen vacancies in the gate stack structure. In particular, the present invention is based on a technical effect whereby oxygen vacancies induced in the gate stack layer structure can be controlled by appropriate formation of the layer structure to induce a dipole effect which can shift the threshold voltage as desired. This technical effect is explained in detail below.

Figure 1:
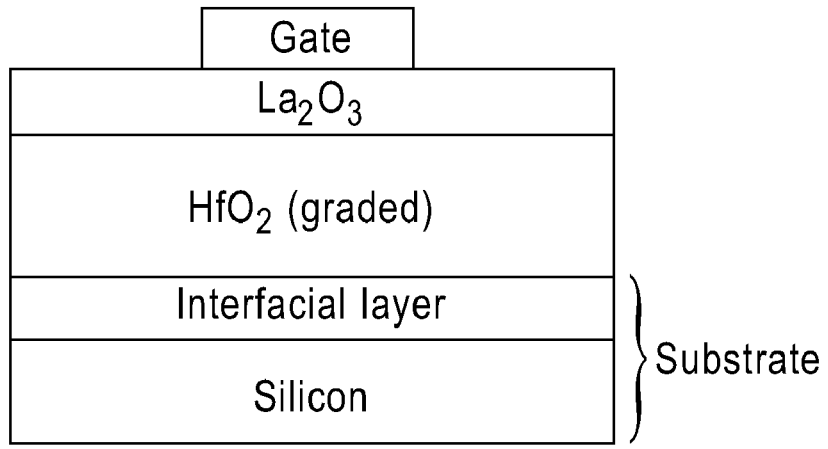
FIG. 1 shows the layer structure of a prior gate stack.

Briefly, the primary effect of introducing an additional layer, e.g. the $La_2O_3$ layer in FIG. 1, to the stack is to increase the amount of oxygen vacancies in the high-K dielectric. These defects are positively charged. By introducing a layer of high-K metallic oxide with higher oxygen vacancy affinity and lower oxygen vacancy diffusivity than the basic high-K dielectric, the oxygen vacancies will tend to accumulate at the interfaces with the new layer. The accumulation of positively charged oxygen vacancies will create a dipole field across each interface with the new, "dipole induction layer".

By appropriate positioning of the dipole induction layer between the gate electrode and substrate, these fields will induce a shift in the energy bands of the gate and/or substrate, hence shifting the device threshold voltage, enabling the threshold voltage to be brought to a desired level. A simple and efficient mechanism is therefore provided for controlling the threshold voltage of MOSFET devices and this mechanism is equally applicable to both n-type and p-type devices. Moreover, due to the effect on oxygen vacancies the dipole induction layer and/or one or more similar layers can provide improved channel mobility in preferred embodiments. This is described further below.

By forming at least one composite layer as defined above on the first layer of high-K material, the dipole induction layer is effectively "sandwiched" between the aforementioned first and second high-K layers. While more than one composite layer could in principle be constructed, in preferred embodiments a single composite layer is formed on the first layer. In any case, the precise positioning of the dipole induction layer (s) necessary to shift the threshold voltage to a desired level will depend on the particular details of a given layer structure, e.g. the particular material, concentration and thickness of layers, as will be apparent to those skilled in the art. However, the underlying principles and specific examples implementing these are described below. In general, the desired level to which the threshold voltage is shifted may be defined specifically or more generally, for example as a specific voltage or a voltage within a desired range, or might simply be defined relative to the threshold voltage in absence of a dipole induction layer, i.e. as higher or lower than that voltage.

The term "metallic oxide" as used herein refers in general to any oxide material containing a metal. Thus, depending on the layer in question, the metallic oxide might be, for example, a metal oxide per se such as $HfO_2$ or $La_yHf_zO_x$, or a metal oxide silicate such as $HfOSi$, or a metal-semiconductor oxide such as the metal silicates $La_yHf_zSiO_x$, $La_yY_zHf_wSiO_x$, etc.

Examples of various possible materials for use in the different layers of the gate stack are given below. In preferred embodiments, however, the dipole induction layer contains at least one of lanthanum and yttrium, and most preferably contains lanthanum.

In general, in forming a given layer of the gate stack on another layer, the given layer may be formed directly or indirectly (i.e. with or without intervening layers) on the other layer except where otherwise specified. Similarly, a given layer may in general be a composite of different constituent layers except as otherwise specified.

The gate electrode is typically a pure metal or metal alloy. In preferred embodiments the gate electrode is formed directly on the composite layer defined above, and the first and second layers include at least one of $HfO_2$ and $HfxSiO$, most preferably $HfO_2$.

As will be understood by those skilled in the art, the formation of one layer on another in the structures in question often results in some degree of merging of the two layers, producing some variation in material concentration through the layers. However, in some embodiments a variation in material concentration may be introduced intentionally in one or more layers. By way of example, the first and second layers may have a metal concentration which is graded in a direction normal to the substrate.

In the structure of FIG. 1, the oxygen vacancies generated as discussed above are at a relatively high concentration and can move quite freely in the $HfO_2$ layer. When near the channel, they can act as strong Coulomb scattering centers which could then be responsible for the observed reduction in mobility. In embodiments of the present invention, the properties and positioning of the dipole induction layer can provide some amelioration of this effect.

In particular, the dipole induction layer can to some extent inhibit movement of oxygen vacancies towards the channel. For example, in an embodiment where the dipole induction layer is closer to the substrate than the gate so that the bulk of the encasing dielectric is on the side of the gate, the dipole induction layer can inhibit migration of oxygen vacancies from the gate side to the substrate side, thus helping to confine oxygen vacancies in a region away from the channel and thereby improving mobility. In preferred embodiments, however, a separate, "barrier layer" is formed in the layer structure to confine oxygen vacancies in this way. This barrier layer is formed in the first layer and includes a high-K metallic oxide having higher oxygen vacancy affinity and lower oxygen vacancy diffusivity than the first layer, whereby the barrier layer inhibits migration of oxygen vacancies across the barrier layer towards the substrate. Like the dipole induction layer, the barrier layer preferably contains at least one of lanthanum and yttrium, and most preferably contains lanthanum. Further details of the preferred form of the barrier layer are given below.

Figure 2:
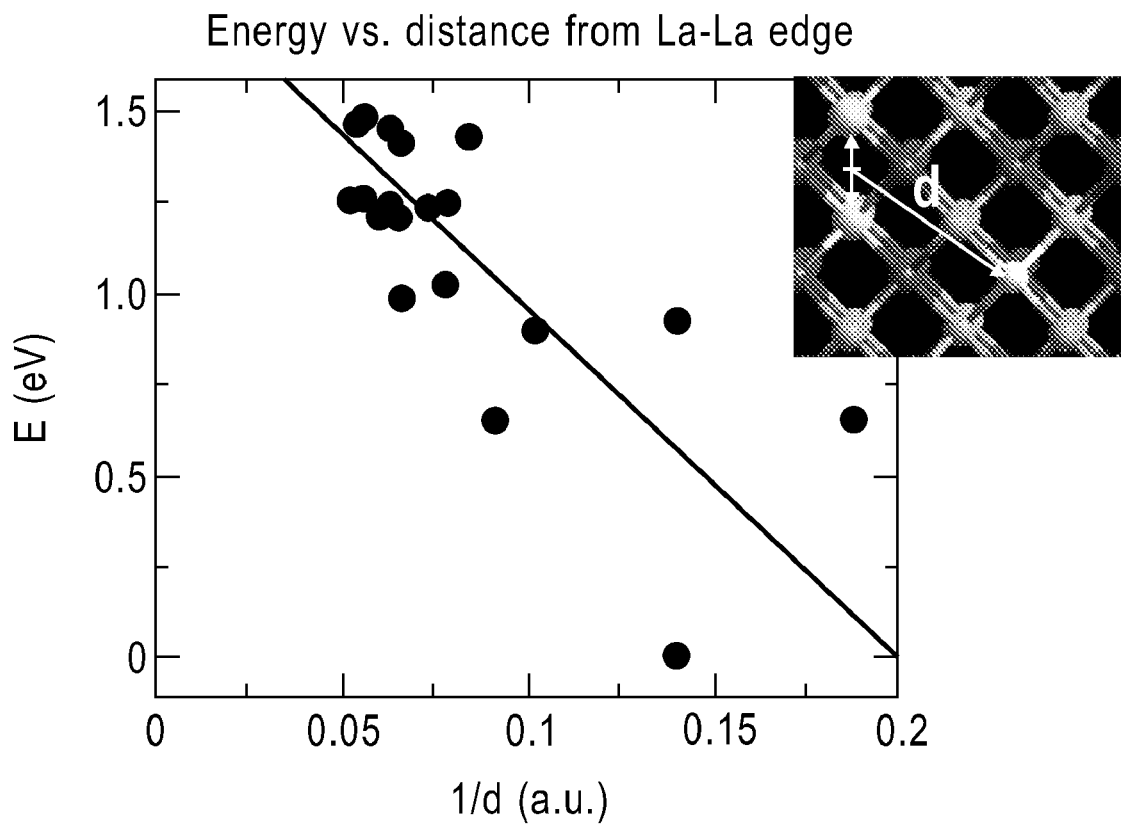
FIGS. 2 and 3 are graphs showing the results of simulations demonstrating behavior of oxygen vacancies in various materials.
Figure 3:
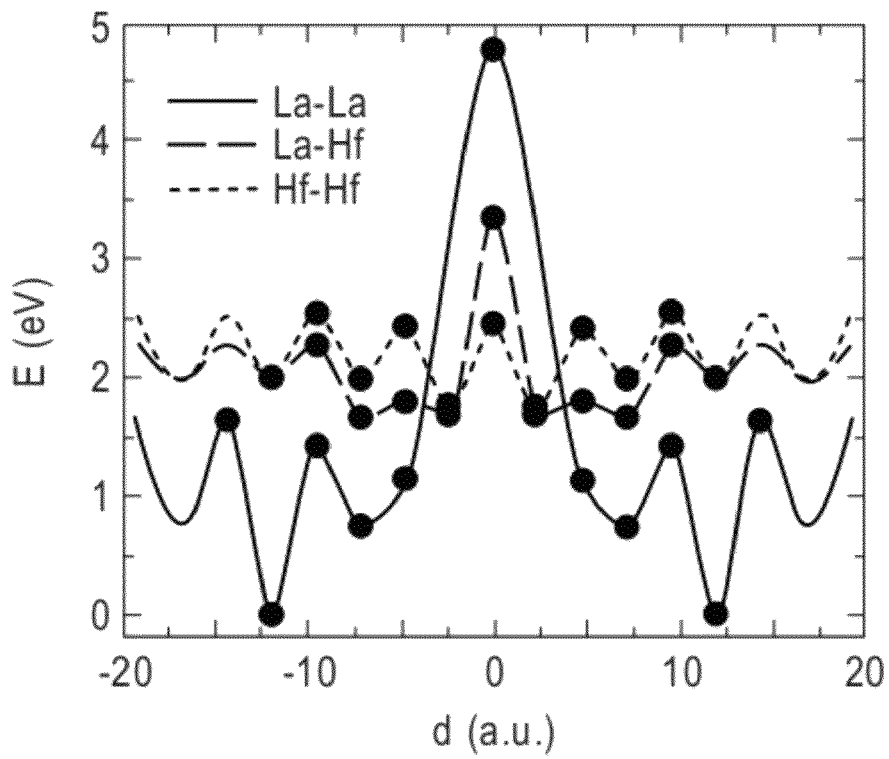

Before describing formation of gate stacks according to embodiments of the present invention, we first illustrate some principles underlying the technical effect on which the embodiments are based. FIGS. 2 and 3 show the results of some first-principles based simulations relating to behavior of oxygen vacancies in various materials. FIG. 2 is a plot of the energy of an oxygen vacancy as a function of the distance from lanthanum atoms in La doped Hf oxide, where the inset figure represents the atomic structure with the pale spheres representing La and Hf atoms and the dark spheres representing oxygen. This figure clearly demonstrates the affinity of La atoms for oxygen vacancies, the binding energy increasing markedly with reducing distance d from La atoms. Oxygen vacancies will therefore tend to accumulate in the vicinity of La atoms.

FIG. 3 plots binding energy of oxygen vacancies as a function of distance from different atomic bridges, specifically La—La bridges, La—Hf bridges and Hf—Hf bridges. This demonstrates the differing energy barriers for oxygen vacancy diffusion along each type of bridge. In particular, the energy at d=0 gives an indication of the activation energy required to pass the bridge. It can be seen that the energy barrier increases in the presence of La, and is by far the highest for the La—La bridge. Thus, La has the effect of increasing the energy barrier for oxygen vacancy diffusion. By way of example, simulation results demonstrated that La has the effect of increasing the energy barrier by one order of magnitude when incorporated in a $HfO_2$ matrix.

The above results indicate that, by controlling the content of La and its distribution, one can control the behavior of oxygen vacancies, in particular the distribution and diffusion of oxygen vacancies. Further results presented below demonstrate that the localization of oxygen vacancies is strongly dependent on La concentration, so that the results can be tuned to give a desired effect by controlling the content and distribution of La. Moreover, while the results illustrated refer specifically to La, similar effects were demonstrated by other materials as indicated below. These effects are exploited in methods embodying the present invention to provide an efficient and flexible mechanism for threshold voltage control in MOSFET gate stacks. Examples will now be described with reference to FIGS. 4 to 7.

Figure 4:
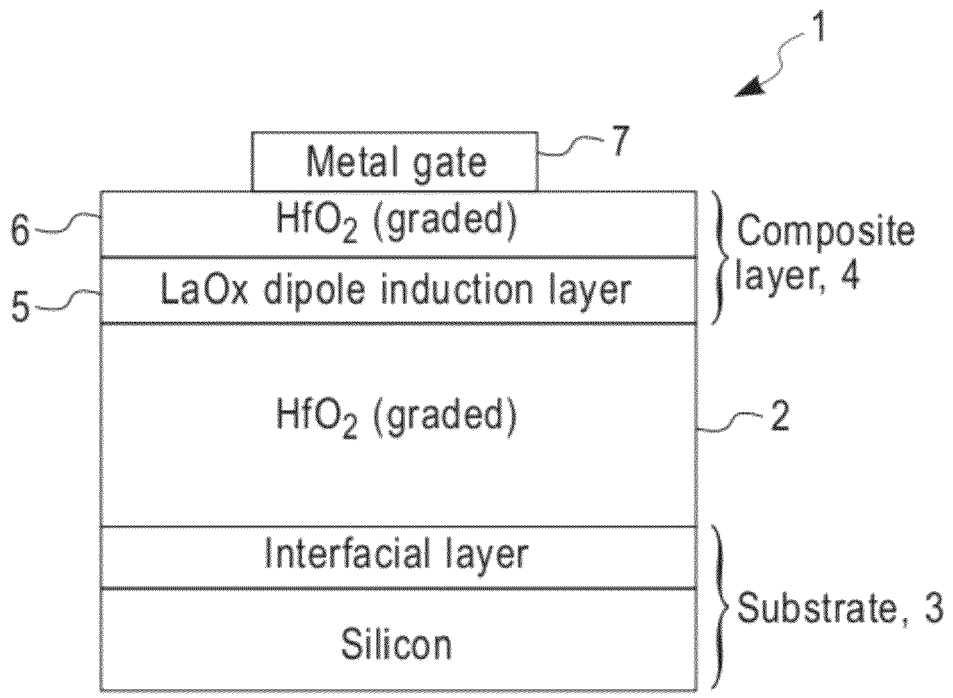
FIG. 4 illustrates a first gate stack formed by a method embodying the present invention.

FIG. 4 is a schematic illustration of a first gate stack 1 formed by a method embodying the present invention. In accordance with this method, a first layer 2 of $HfO_2$ is formed on a silicon substrate 3 which has the usual surface oxide "interfacial" layer caused by oxidation of silicon in the presence of air. The first layer of $HfO_2$ is formed by a process of conventional deposition such as, for example, CVD (chemical vapor deposition), PECVD (plasma-enhanced chemical vapor deposition), sputtering, chemical solution deposition, plating and the like, followed by proper annealing to give a graded concentration of Hf, the concentration being highest nearest to substrate 3.

Next, a composite layer 4, composed of a layer 5 of lanthanum oxide LaOx and a second layer 6 of $HfO_2$, is formed on the first $HfO_2$ layer. The LaOx layer 5 is formed directly on the first $HfO_2$ layer 2 by a process of deposition such as CVD, PECVD, sputtering, chemical solution deposition, plating and the like as before, followed by proper annealing. The second $HfO_2$ layer 6 is formed directly on the LaOx layer 5, again by a process of deposition, such as the exemplary processes given above, followed by proper annealing. Finally, a metal gate electrode 7 is formed directly on the composite layer by direct deposition, such as the exemplary processes given above, followed by proper annealing. In this embodiment the gate electrode 7 is formed of W, but various metals could be used here including, for example, W, Pt, Pd, Ru, Re, Ir, Ta, and Mo.

As discussed above, the introduction of the high-K LaOx layer 5 has the effect of increasing the amount of oxygen vacancies in the adjacent, high-K $HfO_2$ layers 2, 6. As indicated by the results presented above, the LaOx layer 5 has a higher oxygen vacancy affinity and lower oxygen vacancy diffusivity than the $HfO_2$ layers 2, 6. Since the LaOx layer 5 is "sandwiched" directly between the $HfO_2$ layers 2, 6, the resulting oxygen vacancies will tend to accumulate in the vicinity of the La atoms and hence accumulate at the upper and lower interfaces with LaOx layer 5. Since the oxygen vacancies are positively charged, this creates a dipole field (positive in $HfO_2$, negative in LaOx) at each interface. The LaOx layer 5 thus serves as a dipole induction layer, and the dipolar fields generated by this layer can be used to induce a shift in the gate threshold voltage compared to an equivalent gate structure without this layer.

In the particular example of FIG. 4, the gate stack is for a pFET and the layers are formed so as to position the dipole induction layer 5 nearer to gate electrode 5 than substrate 3. In more detail, the dipole induction layer 5 is formed to have a thickness of from 5 Å to 20 Å, and in this preferred embodiment about 10 Å. The average concentration of lanthanum in dipole induction layer 5 is from 30% to 100%, in this preferred embodiment about 30%. In addition, dipole induction layer 5 is spaced at from 5 Å to 20 Å from the gate electrode 7, in this preferred embodiment about 5 Å. With the described layer formation, the dipole induction layer 5 is positioned so as to produce a positive shift in the Fermi energy of the gate metal. This shifts the gate threshold voltage in the appropriate direction for the pFET so as to correct the shift introduced by grading the Hf concentration as discussed earlier. Hence, by forming the gate stack as described, the threshold voltage is controlled to provide a solution for a high-K metal gate pFET based on $HfO_2$.

While the concentration of La in LaOx dipole induction layer 5 of the above embodiment could have any value in the preferred range of 30% to 100%, in some embodiments dipole induction layer 5 could have a graded concentration of La in this range, the concentration increasing in a direction towards the gate electrode 7. Such a LaOx graded layer can be produced by simple La deposition followed by flash annealing.

Figure 5:
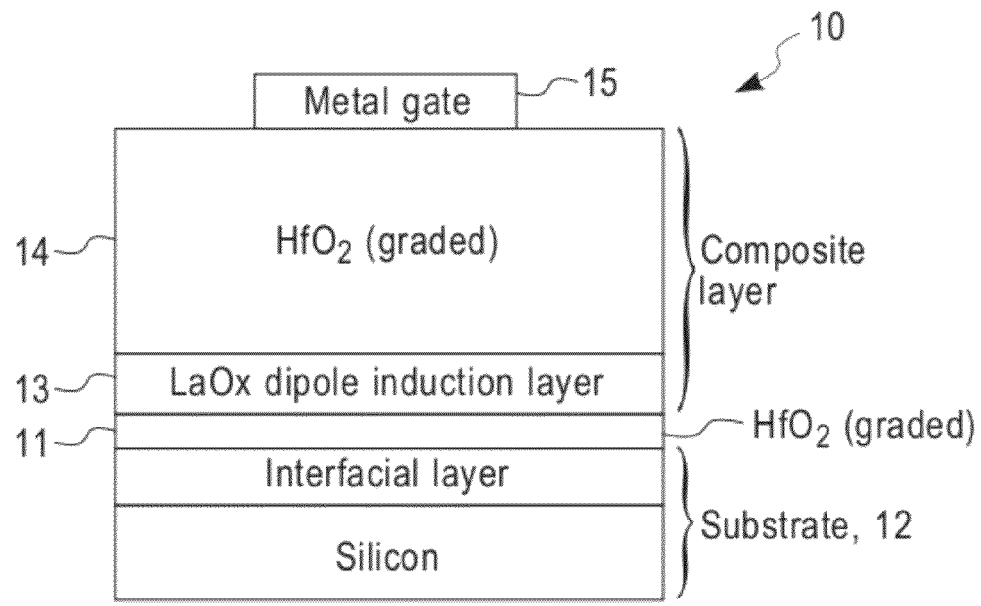
FIG. 5 illustrates a second gate stack formed by a method embodying the present invention.

FIG. 5 is a schematic illustration of a second gate stack 10 formed by a method embodying the present invention. With this method, a first, graded layer 11 of $HfO_2$ is formed on a substrate 12, the Hf concentration being highest nearest to substrate 12 as before. A dipole induction layer 13 of LaOx is formed directly on the first $HfO_2$ layer 11. A second $HfO_2$ layer 14, again with a graded concentration of Hf, is formed directly on the LaOx layer 13. Finally, a metal gate electrode 15 is formed directly on $HfO_2$ layer 14. The various layers 11 to 15 of this gate stack 10 are formed by the same processes as the equivalent layers of the stack 1 of FIG. 4. In this case, however, the layers are formed so as to position the dipole induction layer 13 nearer to substrate 12 than gate electrode 15. In more detail, the dipole induction layer 13 is spaced at from 2.5 Å to 5 Å, in this preferred embodiment about 3 Å from substrate 12, this being the thickness of the first $HfO_2$ layer 11. As before, dipole induction layer 13 has a thickness of from 5 Å to 20 Å, in this preferred embodiment about 10 Å, and contains lanthanum with an average concentration of from 30% to 100%, here about 30%.

With the layer formation of FIG. 5, the dipole induction layer 13 is positioned so as to produce a negative shift in the conduction band of the silicon substrate. In particular, the accumulation of oxygen vacancies at each interface of LaOx layer 13 induces a dipole field which is positive in $HfO_2$ and negative in LaOx as before. Here, however, there will be very few charges in the thin $HfO_2$ layer 11 between the LaOx layer 13 and substrate 12. The overriding effect is therefore due to the negative charge in the LaOx layer which destabilizes the conduction band of silicon with respect to the metal gate. The result is a negative shift in the conduction band of silicon. This negative shift in the silicon conduction band is equivalent to a positive shift in the Fermi energy of the gate as achieved by the method of FIG. 4. Thus, the gate threshold voltage is again shifted in the appropriate direction for a pFET, providing another solution for a high-K metal gate pFET based on $HfO_2$.

While the foregoing describes two exemplary solutions for a pFET based on $HfO_2$ and LaOx, other materials may be employed for the various layers of the gate stack. The first and second high-K layers could be formed of alternative metallic oxide materials such as HfxOSi, ZrO2, ZrxOSi for example, and need not be formed of the same material. Similarly, the dipole induction layer could be formed, in general, of any material having a higher oxygen vacancy affinity and lower oxygen vacancy diffusivity than the high-K material of the first and second layers. In preferred embodiments, however, the dipole induction layer contains at least one of lanthanum and yttrium as these metals have been found to be particularly effective. Examples of preferred materials, which demonstrate good stability, are $La_2O_3$, LayHfzOx, LayHfzSiOx, $Y_2O_3$, and LayYzHfwSiOx, YyZrzOx, YyZrzSiOx.

The precise positioning of the dipole induction layer necessary to shift the threshold voltage to a desired level will depend on the details of the particular layer structure in a given embodiment, e.g. the particular material, concentration and thickness of layers, as will be apparent to those skilled in the art. The appropriate position for a given desired voltage shift can be empirically determined for particular gate stack structures. Moreover, while the above solutions shift the gate threshold voltage in a particular desired direction for a pFET, equivalent techniques can be applied to obtain a voltage shift in the opposite direction.

In particular, reversing the layer configurations of FIGS. 4 and 5 would produce an opposite voltage shift. That is, in the equivalent structure to FIG. 4, the dipole induction layer would be spaced at from 5 Å to 20 Å from the substrate 3 rather than the gate electrode 7. Similarly, in the equivalent structure to FIG. 5, the dipole induction layer would be spaced at from 2.5 Å to 5 Å from the gate electrode 15 rather than the substrate 12. Methods embodying the invention can thus be applied in general to any MOSFET device, whether an nFET, pFET or some combination thereof as in a CMOS device for example.

It will be seen that from the above that, by controlling oxygen vacancies induced in the gate stack layer structure by appropriate formation of the layer structure, methods embodying the present invention generate a dipolar field that can shift the Fermi energy of the gate, or the conduction band of the semiconductor in the channel, towards the appropriate band alignment. A simple yet highly effective mechanism is therefore provided for controlling threshold voltage in any type of MOSFET device.

Due to its effect on oxygen vacancies, the dipole induction layer may additionally provide improved channel mobility in some embodiments. In particular, oxygen vacancies moving in the high-K dielectric near the substrate can act as strong Coulomb scattering centers which may result in reduced carrier mobility in the channel. The dipole induction layer has a relatively low oxygen vacancy diffusivity which can inhibit movement of oxygen vacancies across this layer towards the channel.

Figure 6:
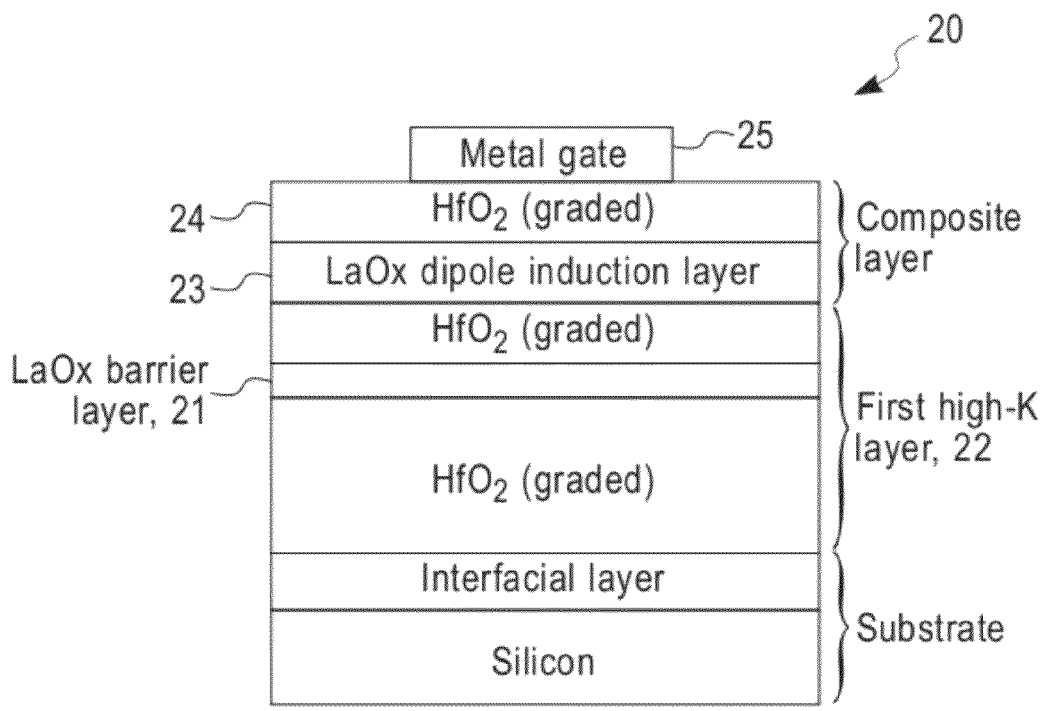
FIG. 6 illustrates a gate stack with a barrier layer formed in accordance with another embodiment of the present invention.

In FIG. 5, for example, where the LaOx layer 13 is close to the substrate so that the bulk of the $HfO_2$ dielectric is on the side of the gate, the LaOx layer may inhibit migration of oxygen vacancies from the gate side to the substrate side, thus helping to confine oxygen vacancies in a region away from the channel and thereby improving mobility. In general, however, the results presented earlier show that the presence of La can significantly increase the energy barrier for oxygen vacancy diffusion so that, by controlling the content of La and its distribution, one can build physical barriers for the oxygen vacancies. FIG. 6 illustrates an exemplary embodiment in which this effect is exploited.

The gate stack structure 20 of FIG. 6 is formed generally as described for the structure 1 of FIG. 4 except that the first layer of high-K dielectric is formed as a composite here. In particular, a barrier layer 21 is formed in the first layer 22 of this stack. The barrier layer 21 is a thin, high-concentration layer of LaOx which presents a substantially non-transparent barrier to vacancy migration. The barrier layer 21 contains an average concentration of lanthanum of at least 80%, in this example about 80%, and has a thickness of from 2.5 Å to 5 Å, in this example about 5 Å. This barrier layer is formed between the component layers of the first $HfO_2$ layer 22 by a deposition process such as CVD, PECVD, sputtering, chemical solution deposition, plating and the like, followed by proper annealing.

In this example, a dipole induction layer 23 is then formed with a graded concentration of LaOx as described above. A second $HfO_2$ layer 24 and gate electrode 25 are then formed as for FIG. 4. The barrier layer 21 inhibits migration of oxygen vacancies across the barrier layer towards the substrate. Thus, oxygen vacancies induced by formation of the dipole induction layer will be confined in the region above barrier layer 21, i.e. far away from the channel. In this way, the reduction of carrier mobility by Coulomb scattering can be ameliorated. Note that, in this preferred embodiment, the barrier layer 21 is positioned substantially midway between the gate electrode and the substrate. This negates any potential effect on the energy bands, due to the effect of barrier layer 21 on oxygen vacancies, which might otherwise interfere with the effect of dipole induction layer 23.

Figure 7:
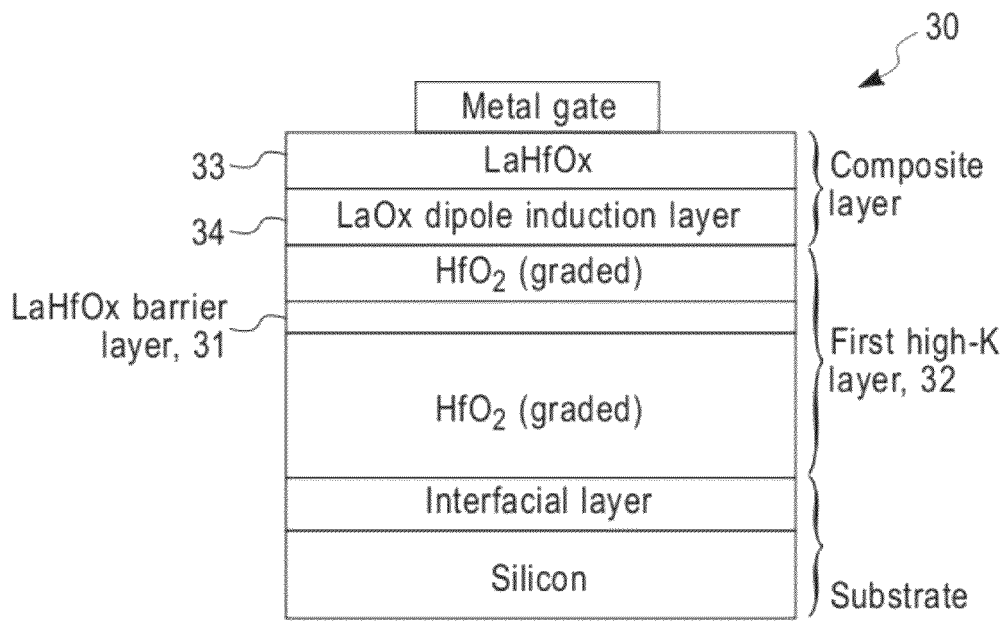
FIG. 7 illustrates another gate stack formed in accordance with a further embodiment.

While the barrier layer is formed of LaOx in FIG. 6, other high-K metallic oxides with higher oxygen vacancy affinity and lower oxygen vacancy diffusivity than the adjacent dielectric layers can be employed here. Lanthanum and yttrium are particularly effective however, exemplary materials for the barrier layer being $La_2O_3$, LaxHfyOx, LaxHfySiOx, $Y_2O_3$, and LaxYyHfzSiOx. For example, FIG. 7 illustrates formation of another gate stack structure in accordance with an embodiment of the present invention. This structure 30 is formed generally as described for FIG. 6, except that in this case the barrier layer 31 is formed of LaHfOx having a high La concentration.

Figure 8:
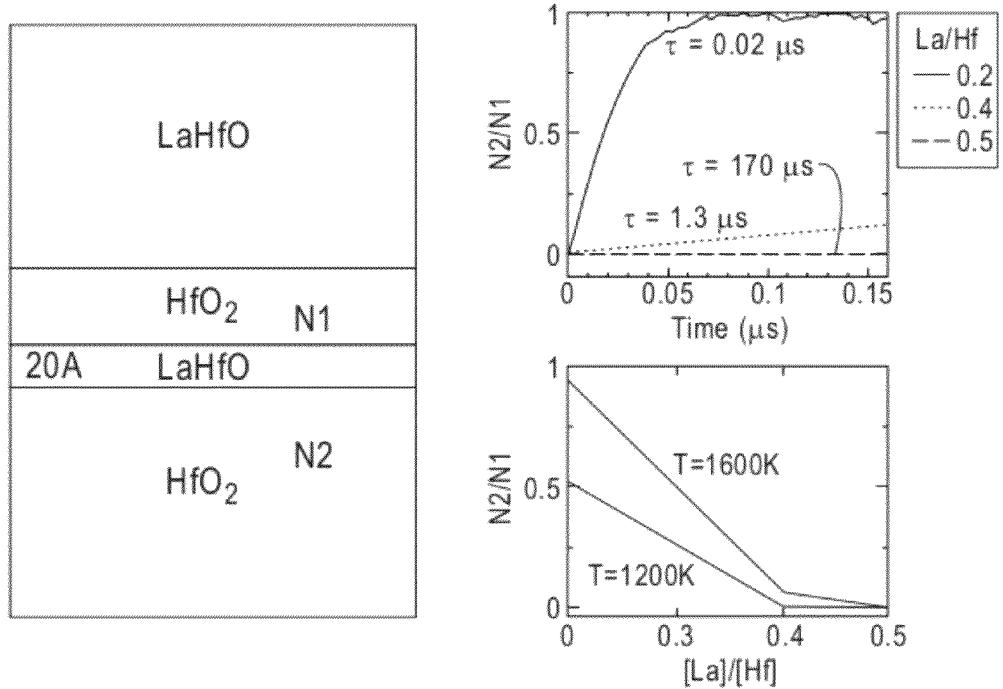
FIG. 8 demonstrates effectiveness of a barrier layer in gate stacks under varying conditions.

The second high-K dielectric layer 33 is also formed of LaHfOx, in this case having a low concentration of La compared with the LaOx dipole induction layer 34. In general, the feasibility of the barrier layer has been demonstrated by the results of our first-principles based simulations of oxygen vacancy diffusion in an appropriate stack geometry. These results are illustrated in FIG. 8. This shows a partial stack structure containing a barrier layer of LaHfO between layers N1 and N2 of an HfO2 dielectric similar to the structures of FIGS. 6 and 7 but with larger sizes for modeling reasons. The upper graph on the right of the figure shows how the ratio of oxygen vacancies in N2 to N1 varies with time for different relative concentrations of La and Hf. The lower graph shows the effect of temperature on oxygen vacancy diffusion.

This figure clearly demonstrates the effectiveness of the barrier layer in confining oxygen vacancies. Moreover, the upper graph shows that a small difference in La concentration makes a significant difference to the effectiveness of the barrier. Thus the confinement of oxygen vacancies can be tuned as required, allowing channel mobility to be restored to acceptable levels.

It will be appreciated that many changes and modifications can be made to the exemplary embodiments described. For example, while the simple structures described above are preferred, embodiments can be envisaged where more than one composite layer, composed of a dipole induction layer and second high-K layer, is formed on the first high-K layer. As another example, intervening layers might be formed between the first high-K layer and the substrate, or the second high K layer and the gate, in some embodiments. Various other changes and modifications can be made without departing from the scope of the invention.

What is claimed is:

1. A method for forming a high-K gate stack for a MOSFET device to control the threshold voltage for the MOSFET device, the method comprising:

forming a first layer of high-K metallic oxide on a semiconductor substrate, the first layer having a barrier layer sandwiched between portions of the high-K metallic oxide of the first layer;

forming at least one composite layer directly on said first layer, said composite layer including a second layer of high-K metallic oxide formed directly on a dipole induction layer, the dipole induction layer comprising a high-K metallic oxide having higher oxygen vacancy affinity and lower oxygen vacancy diffusivity than said first and second layers; and forming a metallic gate electrode on said at least one composite layer;

wherein formation of said layers is such as to position the dipole induction layer of said at least one composite layer between the gate electrode and substrate to shift said threshold voltage to a desired level.

2. The method according to claim 1 wherein the dipole induction layer contains at least one of lanthanum and yttrium.

3. The method according to claim 2 wherein the dipole induction layer comprises at least one of La2O3, LayHfzOx, LayHfzSiOx, Y2O3 and LaYzHfwSiOx.

4. The method according to claim 1 wherein a single composite layer is formed on the first layer.

5. The method according to claim 4 wherein the dipole induction layer has a thickness of from 5 Å to 20 Å, contains lanthanum with an average concentration of from 30% to 100%, and is spaced at from 5 Å to 20 Å from one of the gate electrode and substrate.

6. The method according to claim 5 wherein formation of said layers is such as to position the dipole induction layer one of nearer to the gate electrode than to the substrate or nearer to the substrate than to the gate electrode.

7. The method according to claim 4 wherein the dipole induction layer has a thickness of from 5 Å to 20 Å, contains lanthanum with an average concentration of from 30% to 100%, and is spaced from 2.5 Å to 5 Å from one of the gate electrode and substrate.

8. The method according to claim 7 wherein formation of said layers is such as to position the dipole induction layer one of nearer to the gate electrode than to the substrate or nearer to the substrate than to the gate electrode.

9. The method according to claim 1 wherein the gate electrode is formed directly on said composite layer.

10. The method according to claim 1 wherein said first and second layers comprise at least one of HfO2 and HfxOSi.

11. The method according to claim 10 wherein the first and second layers are formed such that the concentration of Hf increases in a direction away from the substrate.

12. The method according to claim 1 wherein the barrier layer comprises a high-K metallic oxide having higher oxygen vacancy affinity and lower oxygen vacancy diffusivity than the portions, whereby the barrier layer inhibits migration of oxygen vacancies across the barrier layer towards the substrate.

13. The method according to claim 12 wherein the barrier layer contains at least one of lanthanum and yttrium.

14. The method according to claim 13 wherein the barrier layer comprises at least one of La2O3, LaxHfyOx, LaxHfySiOx, Y2O3, and LaxTyHfzSiOx.

15. The method according to claim 14 wherein the barrier layer contains lanthanum with an average concentration of at least 80% and has a thickness of from 2.5 Å to 5 Å.

16. The method according to claim 12 wherein the barrier layer is positioned substantially midway between the gate electrode and substrate.

17. A high-K gate in a MOSFET device formed by the method of claim 1.

* * * * *